(12) United States Patent
Kozyrev et al.

(10) Patent No.: US 7,135,917 B2
(45) Date of Patent: Nov. 14, 2006

(54) LEFT-HANDED NONLINEAR TRANSMISSION LINE MEDIA

(75) Inventors: Alexander B. Kozyrev, Madison, WI (US); Daniel W. van der Weide, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 121 days.

(21) Appl. No.: 10/860,389

(22) Filed: Jun. 3, 2004

(65) Prior Publication Data

US 2005/0270091 A1    Dec. 8, 2005

(51) Int. Cl.
*H03F 7/06* (2006.01)
*H04B 3/04* (2006.01)

(52) U.S. Cl. .......................... 330/4.7; 333/20
(58) Field of Classification Search ............ None
See application file for complete search history.

(56) References Cited

U.S. PATENT DOCUMENTS

| | | | | |
|---|---|---|---|---|
| 3,711,780 A * | 1/1973 | Maurer | ........................ | 330/4.5 |
| 3,842,360 A * | 10/1974 | Dickens | ........................ | 330/4.9 |
| 3,919,656 A * | 11/1975 | Sokal et al. | ................... | 330/51 |
| 4,344,052 A * | 8/1982 | Davidson | .................... | 333/222 |
| 4,701,714 A * | 10/1987 | Agoston | ..................... | 327/277 |
| 4,855,696 A | 8/1989 | Tan et al. | ..................... | 333/20 |
| 5,274,271 A * | 12/1993 | McEwan | ..................... | 307/108 |
| 5,352,994 A | 10/1994 | Black et al. | ................... | 333/33 |
| 5,789,994 A * | 8/1998 | Case et al. | .................... | 333/20 |
| 6,310,959 B1 * | 10/2001 | Alexander | ................... | 381/99 |
| 6,476,685 B1 * | 11/2002 | Cheung | ..................... | 333/28 R |
| 6,512,483 B1 * | 1/2003 | Holden et al. | ............... | 343/701 |
| 6,538,525 B1 | 3/2003 | Williamson | .................. | 310/53 |
| 6,593,831 B1 * | 7/2003 | Nguyen | ..................... | 333/133 |
| 6,608,811 B1 * | 8/2003 | Holden et al. | ............... | 361/303 |
| 6,859,114 B1 * | 2/2005 | Eleftheriades et al. | ....... | 333/156 |
| 6,927,647 B1 * | 8/2005 | Starri et al. | .................. | 333/103 |
| 2001/0038325 A1 | 11/2001 | Smith et al. | ................. | 333/202 |
| 2003/0155919 A1 | 8/2003 | Pendry et al. | ............... | 324/318 |
| 2005/0253667 A1 * | 11/2005 | Itoh et al. | .................... | 333/118 |

OTHER PUBLICATIONS

R.A. Shelby, et al., "Experimental Verification of a Negative Index of Refraction," Science, vol. 292, Apr. 6, 2001, pp. 77-79.

(Continued)

*Primary Examiner*—Robert Pascal
*Assistant Examiner*—Krista M. Flanagan
(74) *Attorney, Agent, or Firm*—Foley & Lardner LLP

(57) ABSTRACT

A left-handed nonlinear transmission line system has multiple nonlinear capacitors connected in series between input and output terminals and multiple inductances connected in parallel between the nonlinear capacitors and a return conductor extending between the input and output terminals. The nonlinear capacitors have a capacitance characteristic that changes with the voltage applied across the capacitors, such as a capacitance that decreases with increasing voltage. A radio frequency signal source is coupled to the input terminals and provides power at a selected drive frequency. Depending on the frequency of the drive signal with respect to the Bragg cutoff frequency of the nonlinear transmission line, the output signal may include a strong signal component at the third harmonic of the input drive signal frequency, components at higher harmonics, or components at fractional frequencies of the input drive signal frequency. Parametric generation of other signal waves that are phase matched with the signal wave produced by the input drive signal is also possible under appropriate conditions. The left-handed nonlinear transmission line system generates such output signal frequencies with high efficiency.

17 Claims, 13 Drawing Sheets

OTHER PUBLICATIONS

Mark, J.W. Rodwell, et al., "Active and Nonlinear Wave Propagation Devices in Ultrafast Electronics and Optoelectronics," Proceedings of the IEEE, vol. 82, No. 7, Jul. 1994, pp. 1037-1059.

Anthony Grbic, et al., "Overcoming the Diffraction Limit with a Planar Left-Handed Transmission-Line Lens," Physical Review Letters, vol. 92, No. 11, Mar. 19, 2004, pp. 117403-1-117403-4.

Alexander A. Zharov, et al., "Nonlinear Properties of Left-Handed Metamaterials," Physical Review Letters, vol. 91, No. 3, Jul. 18, 2003, pp. 037401-1-037401-4.

D.R. Smith, et al., "Composite Medium with Simultaneously Negative Permeability and Permittivity," Physical Review Letters, vol. 84, No. 18, May 1, 2000, pp. 4184-4187.

A.S. Gorshkov, et al., "Parametric Generation in Abomalously Dispersive Media," Physica D, vol. 122, 1998, pp. 161-177.

Anthony Grbic, et al., "Experimental Verification of Backward-Wave Radiation from a Negative Refractive Index Metamaterial," Journal of Applied Physics, vol. 92, No. 10, Nov. 15, 2002, pp. 5930-5935.

Ilya V. Shadrivov, et al., "Nonlinear Surface Waves in Left-Handed Materials," Physical Review E, vol. 69, No. 016617, 2004, pp. 016617-1-016617-9.

Keith S. Champlin, et al., "Small-Signal Second-Harmonic Generation by a Nonlinear Transmission Line," IEEE Transactions on Microwave Theory and Techniques, vol. MMT-34, No. 3, Mar. 1986, pp. 351-353.

Christophe Caloz, et al., "A Novel Composite Right-/Left-Handed Coupled-Line Directional Coupler with Arbitrary Coupling Level and Broad Bandwidth," IEEE Transactions on Microwave Theory and Techniques, vol. 52, No. 3, Mar. 2004, pp. 980-992.

Jean-Marc Duchamp, et al., "Comparison of Fully Distributed and Periodically Loaded Nonlinear Transmission Lines," IEEE Transactions on Microwave Theory and Techniques, vol. 51, No. 4, Apr. 2003, pp. 1105-1116.

George V. Eleftheriades, et al., "Planar Negative Refractive Index Media Using Periodically L-C Loaded Transmission Lines," IEEE Transactions on Microwave Theory and Techniques, vol. 50, No. 12, Dec. 2002, pp. 2702-2712.

A.B. Kozyrev, "The Structure of a Shock Electromagnetic Wave Synchronous with Several Wave Propagating in Coupled Transmission Lines with Different Types of Dispersion," Technical Physics, vol. 47, No. 2, 2002, pp.. 272-274.

Marco A. Antoniades, et al., "Compact Linear Lead/Lag Metamaterial Phase Shifters for Broadband Applications," IEEE Antennas and Wireless Propagation Letters, vol. 2, 2003, pp. 103-106.

A.M. Belyantsev, et al., "RF Oscillation Generated by an Electromagnetic Shock Wave in Coupled Transmission Lines with Anomalous and Normal Dispersion," Technical Physics, vol. 46, No. 7, 2001, pp. 864-867.

A.M. Belyantsev, et al., "Reversed Doppler Effect under Reflection from a Shock Electromagnetic Wave," Technical Physics, vol. 47, No. 11, 2002, pp. 1477-1480.

Jian Qi Shen, "Introduction to the Theory of Left-Handed Media," Feb. 7, 2004, pp. 1-14.

O. Reynet, et al., "Voltage Controlled Metamaterial," Applied Physics Letters, vol. 84, No. 7, Feb. 16, 2004, pp. 1198-1200.

Christophe Caloz, et al., "Characteristics and Potential Applications of Nonlinear Left-Handed Transmission Lines," Microwave and Optical Technology Letters, vol. 40, No. 6, Mar. 20, 2004, pp. 471-473.

* cited by examiner

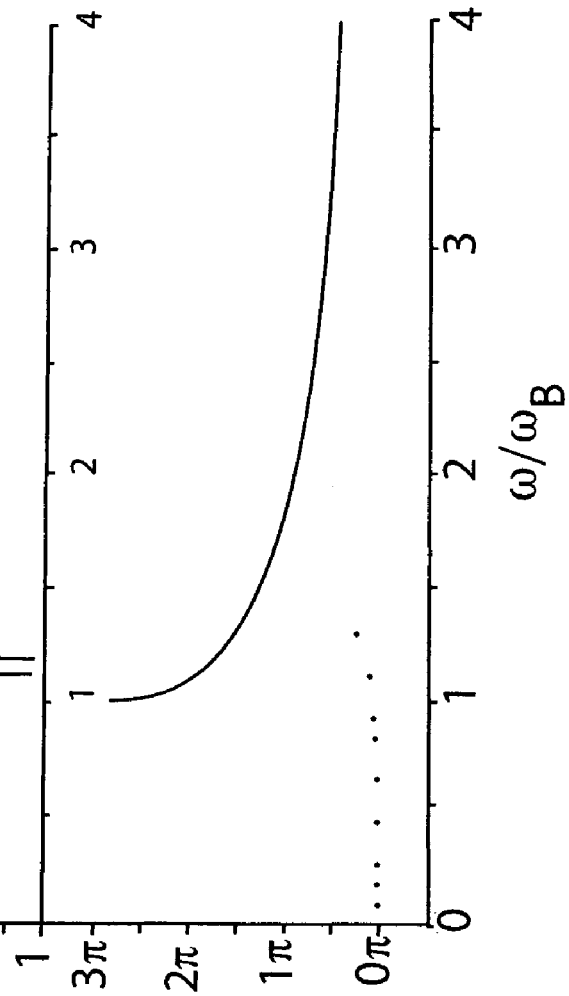

LEFT-HANDED NONLINEAR TRANSMISSION LINE MEDIA

STATEMENT OF GOVERNMENT RIGHTS

This invention was made with United States government support awarded by the following agencies: USAF/AFOSR F49620-03-1-0420. The United States government has certain rights in this invention.

FIELD OF THE INVENTION

The present invention pertains generally to the field of nonlinear transmission lines and left-handed artificial media.

BACKGROUND OF THE INVENTION

Artificial materials (metamaterials) with simultaneously negative permeability and permittivity are sometimes called left-handed (LH) materials. LH materials often use arrays of metallic wires and arrays of split-ring resonators or planar transmission lines periodically loaded with series capacitors and shunt inductors. See, e.g., D. R. Smith, W. J. Padilla, D. C. Vier, S. C. Nemat-Nasser, and S. Schultz, "Composite medium with simultaneously negative permeability and permittivity", Phys. Rev. Lett., Vol. 84, No. 18, pp. 4184–4187, May 2000; G. V. Eleftheriades, A. K. Iyer, and P. C. Kremer, "Planar negative refractive index media using periodically L-C loaded transmission lines," IEEE Trans. Microwave Theory & Tech., Vol. 50, No. 12, pp. 2702–2712, December 2002; A. Grbic and G. V. Eleftheriades, "Overcoming the diffraction limit with a planar left-handed transmission-line lens", Phys. Rev. Lett., Vol. 92, No. 11, p. 117403, 19 Mar. 2004. The unique electrodynamic properties of these materials, first predicted by Veselago in 1968, include the reversal of Snell's law, the Doppler effect, Cherenkov radiation and negative refractive index, making them attractive for new types of radio frequency (rf) and microwave components. V. G. Veselago, "The electrodynamics of substances with simultaneously negative values of $\epsilon$ and $\mu$," Sov. Phys.-Usp., Vol. 10, No. 4, pp. 509–514, January-February 1968. The most tantalizing is the possibility of realizing "perfect" (diffraction-free) lenses because of their inherent negative index of refraction. R. A. Shelby, D. R. Smith, and S. Schultz, "Experimental verification of a negative index of refraction," Science, Vol. 292, pp. 77–79, April 2001; A. Grbic and G. V. Eleftheriades, "Overcoming the diffraction limit with a planar left-handed transmission-line lens," Phys. Rev. Lett., Vol. 92, No. 11, p. 117403, 19 Mar. 2004.

Most studies of LH media are in the linear regime of wave propagation and have already inspired new types of microwave devices, such as LH phase-shifters and LH directional couplers. M. A. Antoniades, G. V. Eleftheriades, "Compact linear lead/lag metamaterial phase shifters for broadband applications", IEEE Antennas and Wireless Propagation Lett., Vol. 2, pp. 103–106, 2003. C. Caloz, A. Sanada, T. Itoh, "A Novel Composite Right-/Left-Handed Coupled-Line Directional Coupler With arbitrary Coupling Level and Broad Bandwidth," IEEE Trans. Microwave Theory & Tech., Vol. 52, No. 3, pp. 980–992, March 2004. However, materials that combine nonlinearity with the anomalous dispersion of LH media, can give rise to many new and interesting phenomena and applications. A. A. Zharov, I. V. Shadrivov, Y. S. Kivshar, "Nonlinear properties of left-handed metamaterials," Phys. Rev. Lett., Vol. 91, No. 3, p. 037401, 18 Jul. 2003. Some nonlinear wave phenomena that occur during propagation along the boundary between right-handed (RH) and LH media, when one or both of them are nonlinear, have been reported in A. M. Belyantsev, A. B. Kozyrev, "RF oscillation generation in coupled transmission lines with anomalous and normal dispersion," Technical Physics, Vol. 46, No. 7, pp. 864–867, 2001; A. B. Kozyrev, "The structure of a shock electromagnetic wave synchronous with several waves propagating in coupled transmission lines with different types of dispersion," Technical Physics, Vol. 47, No. 2, pp. 272–274, 2002; A. M. Belyantsev, A. B. Kozyrev, "Reversed Doppler effect under reflection from a shock electromagnetic wave," Technical Physics, Vol. 47, No. 11, pp. 1477–1480, 2002; I. V. Shadrivov, A. A. Sukhorukov, Y. S. Kivshar, "Nonlinear surface waves in left-handed materials," Phys. Rev. E, Vol. 69, No. 1, p. 016617, January 2004.

SUMMARY OF THE INVENTION

A left-handed nonlinear transmission line system in accordance with the present invention may be operated in three different regimes or modes: 1) generation of higher harmonics (conversion of a fundamental drive signal to an output signal enriched with higher harmonics of the fundamental signal); 2) parametric generation/amplification; 3) generation of fractional frequencies of the fundamental input drive signal frequency. The mode of operation is determined by the parameters of the left-handed nonlinear transmission line system and can be controlled electronically by varying the amplitude and frequency of the input drive signal. Mixed modes of operation are also possible under appropriate conditions.

The left-handed nonlinear transmission line system of the invention includes multiple nonlinear capacitors connected together at nodes in series between input and output terminals with multiple inductances connected in parallel between the capacitors and a return conductor that extends between the input and output terminals. The nonlinear capacitors and the inductances connected in parallel therewith form a plurality of nonlinear transmission line sections connected together between the input and output terminals. The nonlinear capacitors may have a symmetric non-constant capacitance characteristic such that the effective capacitance decreases with the absolute value of the voltage applied across the capacitor. Such capacitors may be formed, for example, utilizing back-to-back varactor diodes. The nonlinear capacitors may also have an asymmetrical voltage-capacitance characteristic, for example, as implemented with a DC bias applied to a single varactor diode. A radio frequency (RF) source is coupled to the input terminals, preferably through an input coupling capacitor, and the output terminals are coupled to a load. The left-handed nonlinear transmission line system may be implemented by mounting back-to-back varactor diodes on an insulating base, which are connected together by metalized connectors formed on the base surface that extend to contacts on the diodes, and with metal connectors extending from a connection to a diode to a ground plane conductor to form the parallel inductances. The system of the invention may also be implemented in nonlinear transmission lines in two or three dimensions, in which a two or three dimensional array of nodes have nonlinear capacitors connected between pairs of nodes, and wherein inductances extend from connections to the nonlinear capacitors in the array to a ground return conductor that extends between the input and output terminals. To provide efficient generation of third harmonics in a left-handed nonlinear transmission line medium (system) the absolute value of phase mismatch per one stage of LH NLTL system $|\beta_3-3\beta_1|$ should be close to $\pi$ ($\beta_1$ and $\beta_3$ are relative wave numbers or phase shifts per one stage for fundamental and $3^{rd}$ harmonic respectively). The nonlinear transmission line system of the invention can be implemented with fewer discrete transmission line sections than are required for right-handed transmission lines to get the same ratio of the power conversion. Harmonic generation is possible over a significantly wider operating frequency range and at relatively higher frequencies in comparison with the conventional right-handed nonlinear transmission line. At some parameters (when $|\beta_1|>\omega_1/c$ and $|\beta_3|<3\omega_1/c$, $\omega_1$ is the frequency of fundamental input signal and c is the velocity of light in free space) the left-handed nonlinear transmission line can be the wave guide for the fundamental input signal and a leaky-wave antenna for the generated third harmonic, thus significantly simplifying the radiation of the generated power. Furthermore, the left-handed nonlinear transmission lines of the invention have advantages from a design perspective, since there is more freedom to optimize parameters as the design is less restricted by the host waveguide structures than in the case of a right-handed periodically loaded nonlinear transmission line. The system of the invention can be the basis for highly efficient and powerful frequency multipliers. Longer (e.g., 7-stages or more) left-handed transmission lines can also be used for parametric generation and amplification. Parametric amplification in a two-dimensional (2-D) LH-NLTL can be used, for example, to realize a very-low-noise conformal radar active or amplifying receiver array that functions as a "perfect lens" without diffraction. The nonlinear transmission line system of the invention may also be utilized to generate an output signal to the load having components at frequencies that are fractional frequencies of the input drive signal frequency, particularly where the drive signal frequency is greater than three times the Bragg cutoff frequency.

Further objects, features and advantages of the invention will be apparent from the following detailed description when taken in conjunction with the accompanying drawings.

BRIEF DESCRIPTION OF THE DRAWINGS

In the drawings:

FIG. 3 is a graph illustrating the dependence of the function $F_A$ for both left-handed (solid line) and right-handed (dotted line) nonlinear transmission lines.

FIG. 4 is a graph illustrating the dependence of the magnitude of the phase mismatch on the relative fundamental frequency for both left-handed (solid line) and right-handed (dotted line) nonlinear transmission line systems.

DETAILED DESCRIPTION OF THE INVENTION

Figure 1:
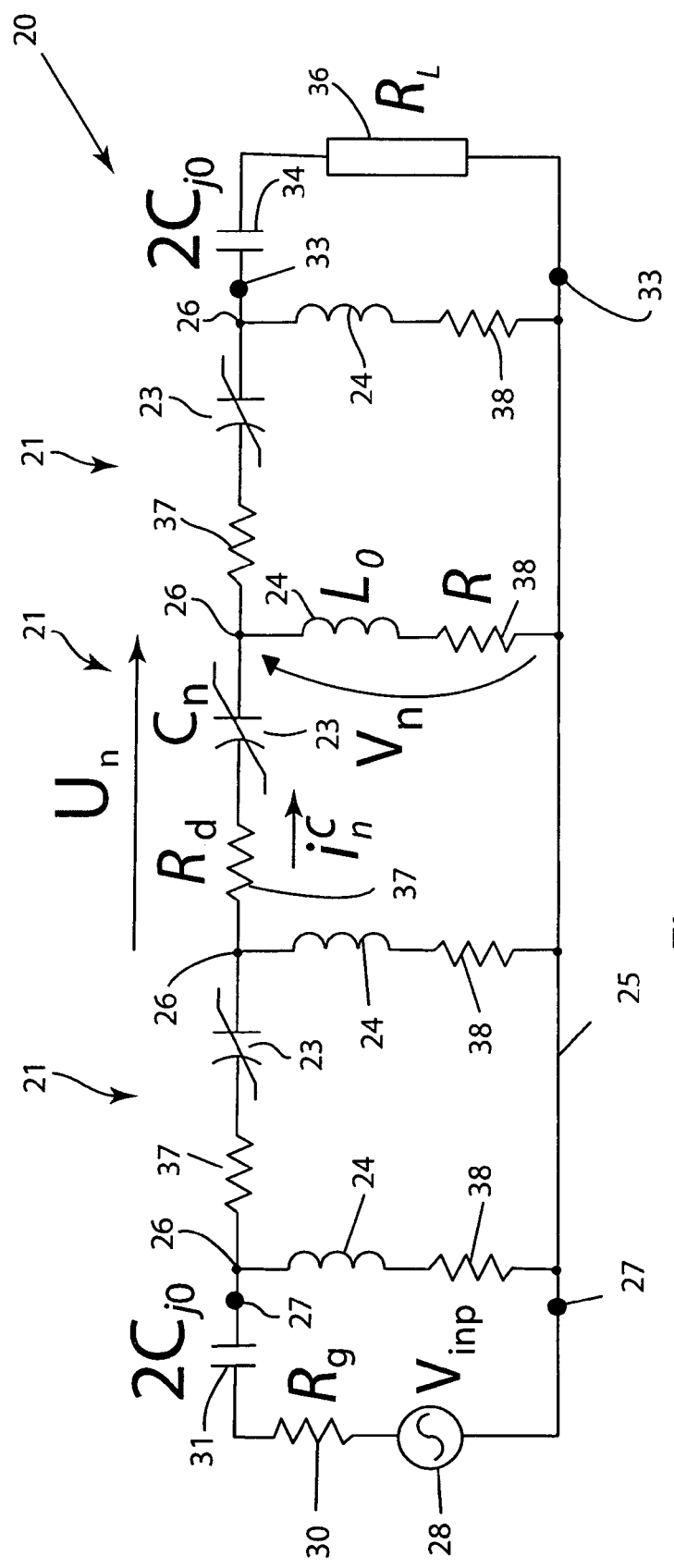
FIG. 1 is a schematic circuit diagram of a left-handed nonlinear transmission line system in accordance with the invention.
Figure 2:
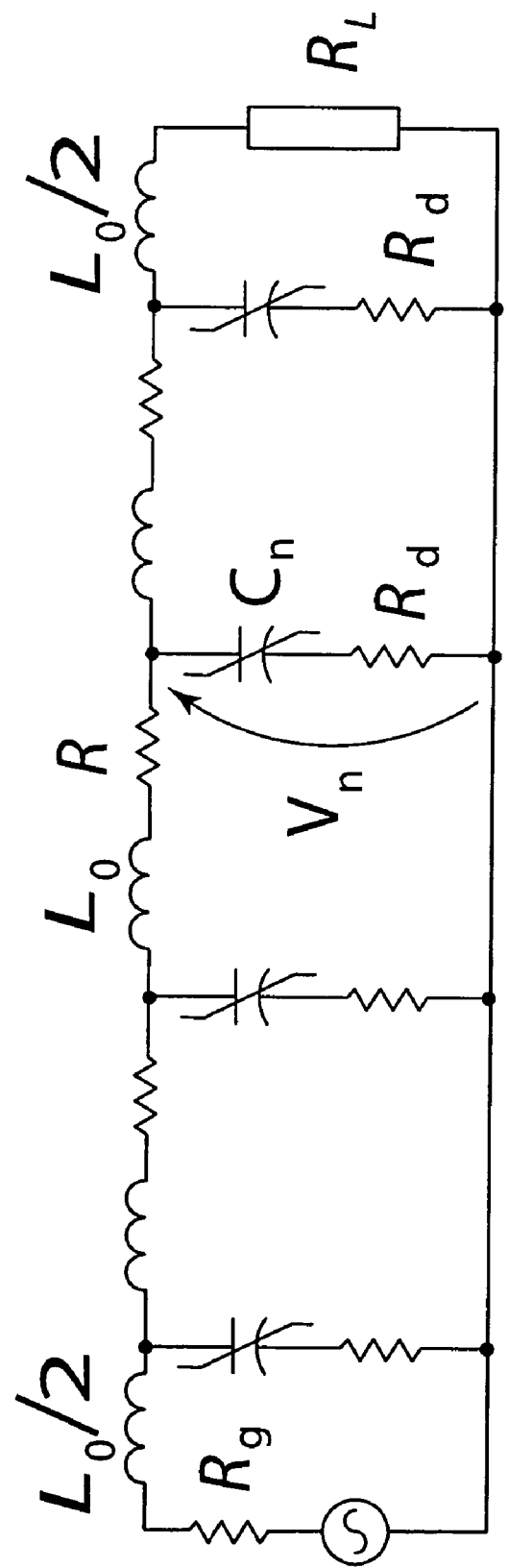
FIG. 2 is a schematic circuit diagram of a conventional right-handed nonlinear transmission line system.

For purposes of illustrating the invention, a one-dimensional left-handed nonlinear transmission line (1D LH NLTL) circuit 20 having multiple discrete transmission line sections is shown in FIG. 1. Each section 21 includes a nonlinear series capacitor 23 (of capacitance $C_n$) and a parallel inductor 24 (of inductance $L_0$) connected to a return or ground line 25. Adjacent capacitors are connected together at nodes 26 and an inductor 24 is connected from each node 26 to the return line 25. The system 20 is supplied with a drive signal at input terminals 27 from a source 28 with internal resistance 30 and coupled through a capacitance 31, and the system 20 is coupled at output terminals 33 through a capacitance 34 to a load 36. The circuit of FIG. 1 may be viewed as the dual of the conventional right-handed nonlinear transmission line (RH NLTL) shown in FIG. 2. In the linear case $C_n=C_{j0}$ (capacitance per section), and in the zero loss case, $R_d=R=0$ ($R_d$ and R are the resistances of the resistors 37 and 38 accounting for loss in capacitors and inductors, respectively, and connected in series with them), and the dispersion relation is $$\omega^2 = \frac{1}{4L_0 C_{j0}\sin^2\beta/2} \qquad (1)$$

Here $\beta$ is the phase shift (in radians) per section and $L_0$ is the inductance per section. The value $\beta=\pi$ corresponds to the boundary of the transparency band (the minimal frequency of the propagating wave, also known as the Bragg cutoff frequency):

$$\omega_B = \frac{1}{2\sqrt{L_0 C_{j0}}} \qquad (2)$$

In the linear limit (where the capacitors 23 are linear capacitors), the left-handed (LH) circuit 20 is a high pass filter. When $\omega$ is increased, $\beta$ decreases monotonically (anomalous dispersion), and thus the fundamental wave ($-\pi \leq \beta_0 \leq \pi$) propagating in this structure is backward (i.e., the phase and group velocities are directed in opposite directions). This property permits us to refer to this structure as left-handed (in Veselago's terminology). See V. G. Veselago, supra.

The following considers $3^{rd}$ harmonic generation in the LH transmission line system 20 analytically. The approach used is that discussed in K. S. Champlin, D. R. Singh, "Small-signal second-harmonic generation by a nonlinear transmission line," IEEE Trans. Microwave Theory & Tech., Vol. MTT-34, No. 3, March, 1986, pp. 351–353, for conventional homogeneous right-handed nonlinear transmission lines to derive an analytical expression for the amplitude of the $2^{nd}$ harmonic to $3^{rd}$ harmonic generation in the discrete left-handed nonlinear transmission line system of the invention.

Nonlinear wave processes in the LH system 20 are governed by Kirchhoff's laws, stated here as equations (3) and (4).

$$\frac{dQ_{n+1}}{dt} - \frac{dQ_n}{dt} + G(U_{n+1} - U_n) = i_n^L \qquad (3)$$

$$L_0 \frac{di_n^L}{dt} = V_n - i_n^L R \qquad (4)$$

Here, $V_n$ and $i_n^L$ are the voltage at the n-th node and current through the n-th inductor, $U_n = V_n - V_{n-1}$ is the voltage across the n-th nonlinear capacitor, $Q_n$ is the charge stored in the n-th capacitor. To simplify the analytical expressions in this section, the effect of resistance $R_d$ is accounted for with a conductance G (not shown in FIG. 1) connected in parallel with the capacitors 23. This produces an equivalent circuit when the specific frequency represented by the fundamental excitation is used in the circuit model.

We assume that capacitance $C_n$ of the capacitors 23 possesses a symmetric nonlinear voltage-charge relationship that can be expanded in a convergent Taylor's series:

$$Q_n(U_n) = Q'(0)U_n + \frac{1}{3!}Q'''(0)U_n^3 + \ldots \qquad (5)$$

where $Q'(0) = C_{j0}$ since $dQ_n(U_n) = C_n(U_n)dU_n$.

One can expand $U_n$ and $Q_n$ in a complex Fourier series as follows:

$$U_n(t) = \sum_{m=1}^{\infty} \{U_{m,n} e^{jm\omega t} + U_{m,n}^* e^{-jm\omega t}\}, m = 1, 3, 5 \text{ and} \qquad (6)$$

$$Q_n(t) = \sum_{m=1}^{\infty} \{Q_{m,n} e^{jm\omega t} + Q_{m,n}^* e^{-jm\omega t}\}, m = 1, 3, 5 \qquad (7)$$

where $\omega$ is the lowest-frequency sinusoidal component of $U_n$ and $Q_n$. Eliminating $i_n^L$ between (3) and (4) and substituting (6) and (7) into the resulting differential-difference equation yields (after equating the terms):

$$(-m^2\omega^2 + jm\omega R/L_0)(Q_{m,n+1} - 2Q_{m,n-1}) + (jm\omega G + RG/L_0)(U_{m,n+1} - 2U_{m,n} + U_{m,n-1}) - U_{m,n}/L_0 = 0 \text{ for } m=1,3,5 \qquad (8)$$

Equation (8) represents a system of coupled linear difference equations relating to the $U_{m,n}$ and $Q_{m,n}$ coefficients. By substituting (6) and (7) into (5), and making the assumption that harmonic voltage terms are small compared with $U_{1,n}$, one finds that, to third order, these coefficients are also related by $$Q_{1,n} = Q'(0)U_{1,i} \qquad (9)$$

$$Q_{3,n} = Q'(0)U_{3,i} + \frac{1}{3!}Q'''(0)U_{1,n}^3$$

Thus, the $Q_{m,n}$ coefficients can be systematically eliminated between (8) and (9). For m=1 and 3 this procedure leads to $$U_{1,n+1} - 2U_{1,n} + U_{1,n-1} - \kappa_1^2 U_{1,n} = 0 \qquad (10)$$

and $$U_{3,n+1} - 2U_{3,n} + U_{3,n-1} - k_3^2 U_{3,n} = -\frac{Q'''(0)U_{1,n}^3}{3!(1 - \tan\delta_3)} \qquad (11)$$

where $$\kappa_m^2 = (jm\omega L_0 + R)^{-1}(G + jm\omega Q'(0))^{-1} \text{ and} \qquad (12)$$

$$\delta_3 = \tan^{-1}(G/3\omega Q'(0)) \qquad (13)$$

Equation (10) is the homogeneous discrete wave equation for the fundamental frequency voltage $U_{1,n}$. This fundamental voltage wave serves as the "forcing function" for the third-harmonic voltage wave $U_{3,n}$ according to equation (11). Assuming, for simplicity, that only the positive-traveling fundamental wave is excited, the solution to (10) has the form $$U_{1,n} = U_{1,0} \exp(-\gamma_1 n) \qquad (14)$$

where n is the section number. By substituting (14) into (11), and solving the resultant inhomogeneous difference equation for boundary condition $U_{0,3} = U_{\infty,3} = 0$, one obtains the third-harmonic amplitude $$U_{3,n} = \frac{4K_N U_{1,0}^3 \sinh^2(3\gamma_1/2) e^{-\gamma_3 n}(e^{(\gamma_3 - 3\gamma_1)n} - 1)}{(1 - \tan\delta_3)(\kappa_3^2 - 4\sinh^2(3\gamma_1/2))} \qquad (15)$$

where $K_N$ is a "nonlinearity factor" defined by $$K_N = \frac{Q''(0)}{3!Q'(0)} \text{ and} \tag{16}$$

$$\gamma_m = \alpha_m + j\beta_m = 2\sinh^{-1}\frac{K_m}{2} \tag{17}$$

Assuming relatively small losses $G << 3\omega Q'(0)$ and $R << 3\omega L_0$, one finds the following expression for $3^{rd}$ harmonic generation efficiency $$\eta_3^{LH}(n) = \frac{V_{3,n}^2}{V_{1,0}^2} = K_N^2 U_{1,0}^4 \cdot F_A(\beta_1, \beta_3) \cdot F_C(\phi) \cdot e^{-2\alpha_3 n} \tag{18}$$

Here $F_A(\beta_1,\beta_3)$ is a function which depends on dispersion characteristics only, and determines a maximal conversion efficiency for given frequency, and $F_c(\phi)$ is a periodic in space function which we call "coherence function" by analogy with K. S. Champlin, et al., supra. $F_A$ and $F_C$ are given by (19) and (20):

$$F_A(\beta_1, \beta_3) = \frac{\sin^2\frac{\beta_1}{2}}{\sin^2\frac{\beta_3}{2}}\left(\frac{\sin^2\frac{3\beta_1}{2}}{\sin^2\frac{\beta_3}{2} - \sin^2\frac{3\beta_1}{2}}\right)^2 \tag{19}$$

$$F_C(\phi) = \sin^2\frac{\phi}{2}, \phi = (\beta_3 - 3\beta_1)n \tag{20}$$

In (18) we took into account that $$U_{m,n} = V_{m,n}(1-e^{-j\beta_m}) \tag{21}$$

Applying the technique described above for the right-handed NLTL shown in FIG. 2, one can show that expression for $\eta_3^{RH}(n)$ has exactly the same structure as (18) for the left-handed NLTL system 20, where $F_A$ becomes $$F_A(\beta_1, \beta_3) = F_A^{RH}(\beta_1, \beta_3) = \left(\frac{\sin^2\frac{\beta_3}{2}}{\sin^2\frac{3\beta_1}{2} - \sin^2\frac{\beta_3}{2}}\right)^2 \tag{22}$$

and $\beta_1$, $\beta_3$ and $\alpha_3$ determined by the dispersion equation for the RH NLTL:

$$\alpha_m + j\beta_m = 2\sinh^{-1}\left\{\frac{(jm\omega L_0 + R)^{1/2}(G + jm\omega Q'(0))^{1/2}}{2}\right\} \tag{23}$$

FIGS. 3 and 4 compare $F_A$ and the magnitude of phase mismatch $|\beta_3 - 3\beta_1|$ for both LH and RH nonlinear transmission lines. Although the analytic expression for $3^{rd}$ harmonic generation efficiency in RH and LH nonlinear transmission lines have a similar structure, the qualitative picture of nonlinear wave processes in general, and $3^{rd}$ harmonic generation in particular, in LH nonlinear transmission lines have many distinctions from the RH case. These differences are consequences of the anomalous dispersion of the LH nonlinear transmission lines.

The $3^{rd}$ harmonic generation is possible at $\omega > \omega_B$ in the case of LH nonlinear transmission lines and at $0 \leq \omega \leq \omega_B^{RH}/3$ in the case of RH nonlinear transmission lines, where $\omega_B^{RH} = 2/(L_0 C_{j0})^{1/2}$ is the Bragg frequency in the RH nonlinear transmission lines. Thus, in the case of LH nonlinear transmission lines, $3^{rd}$ harmonic generation is possible in a higher and a wider frequency range than in RH nonlinear transmission lines, with all other parameters being the same (see also FIGS. 3 and 4).

In the case of a RH nonlinear transmission line, the value of $|\beta_3 - 3\beta_1|$ is small in the operating frequency range and tends to zero when the operating frequency goes to zero, $\omega \to 0$, meanwhile $F_A^{RH} \to \infty$, so that the combined effect of functions $F_A^{RH}$ and $F_C(\phi)$ is a linear growth, and the optimal length of the transmission line (the length required to achieve maximum value of conversion efficiency) is determined by the tradeoff between this linear growth and exponential decay due to loss along the line. In the case of left-handed nonlinear transmission line, $|\beta_3 - 3\beta_1|$ is large (see FIG. 4) and so the period of the "coherence function" is short, as is the "coherence length" of interaction of the fundamental wave with its $3^{rd}$ harmonic, defined as $$N_c = \frac{2\pi}{|\beta_3 - 3\beta_1|} \tag{24}$$

for consistency with K. S. Champlin, et al., supra. This gives rise to a highly localized energy exchange between the fundamental wave and its $3^{rd}$ harmonic while propagating along the LH nonlinear transmission line. From eqn. (20) one can easily see that maximum amplitude of the $3^{rd}$ harmonic is achieved when $F_C(\phi)$ is a maximum at the end of the line, and therefore the optimal number of LH nonlinear transmission line sections 21 is $$N_{opt} = \frac{(2k+1)\pi}{\beta_3 - 3\beta_1}, k = 0, 1, 2, 3 \ldots \tag{25}$$

Analysis of eqns. (18)–(20) shows that in spite of the large phase mismatch in the LH nonlinear transmission line, the conversion efficiency can be higher for such systems as compared to RH nonlinear transmission lines for relatively short transmission lines (lines having relatively few sections). The effect of loss can thus also be minimized in the LH nonlinear transmission line system 20 compared to an RH system which would require more sections (and thus more loss) to achieve similar outputs.

Furthermore, FIG. 3 shows that there are two frequencies (wave numbers) when the denominator in eqn. (19) vanishes, and $F_A(\beta_1,\beta_3)$ goes to infinity. At these frequencies, equations (14)–(20) are no longer valid since our approach assumes that $|V_{3,n}| << |V_{1,n}|$. However, these frequencies indicate regions that are promising for efficient harmonic generation.

Thus, the analysis of the function $F_A(\beta_1,\beta_3)$ together with the magnitude of phase mismatch $|\beta_3 - 3\beta_1|$ (or determined by phase mismatch "coherence length" $N_c$) predicts that the $3^{rd}$ harmonic generation in short LH nonlinear transmission line systems can be more efficient than in RH systems of the same length of line. Though it gives clear qualitative scenarios of harmonic generation, our analysis is not valid for the case of strong nonlinearity (large capacitance ratio) and large amplitude. To account for all the factors that affect wave propagation phenomena in LH nonlinear transmission lines, we have carried out detailed computer simulations.

In the simulations it is assumed that the nonlinear capacitors $C_n=C(V_n-V_{n-1})$ are formed by two back-to-back varactor diodes to provide symmetric capacitance-voltage characteristics expressed as:

$$C(V) = \frac{C_{j0}}{(1+|V/V_{j0}|)^M} \quad (26)$$

We used the values for prototype Agilent TC803 hyperabrupt varactor diodes: $C_{j0}=1$ pF, $M=1.039$, $V_{j0}=0.7$V, $R_d=6\Omega$. These diodes were chosen because of their high capacitance ratio: $C(0V)/C(10V)=17$. The input port of the LH nonlinear transmission line system 20 is fed by a sinusoid $V_{inp}=V_0\sin(\omega t)$ from the source 28. The amplitude of the input is chosen such that the voltage drop across the diodes does not exceed the breakdown voltage, $V_{br}=10$V. The circuit is loaded with resistance $R_L=0.8Z_0$ ($Z_0=(L_0/C_{j0})^{1/2}$) which is equal to the generator resistance $R=R_L$ (unless the other specified). Simple 5- and 7-section LH nonlinear transmission lines were simulated with Agilent ADS.

Figure 5:
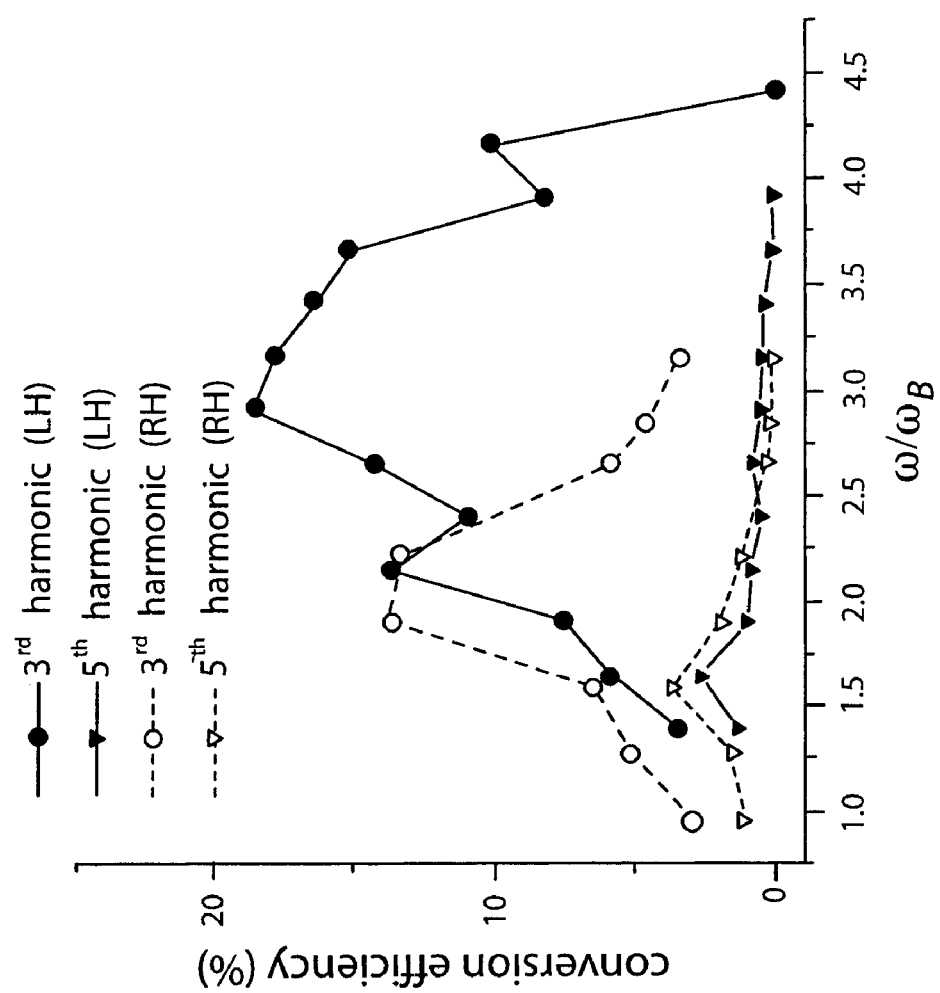
FIG. 5 are graphs illustrating the conversion efficiency in percent for the third and fifth harmonics as a function of the relative fundamental frequency for five section left-handed (solid lines) and right-handed (dashed lines) nonlinear transmission line systems.

FIG. 5 plots the conversion efficiency for the $3^{rd}$ and $5^{th}$ harmonics (the ratio of the harmonic power delivered to the load to the input power applied to the LH system 20) for both LH and dual RH nonlinear transmission lines. One can see that generation of higher harmonics is possible in a limited frequency range.

Figure 6:
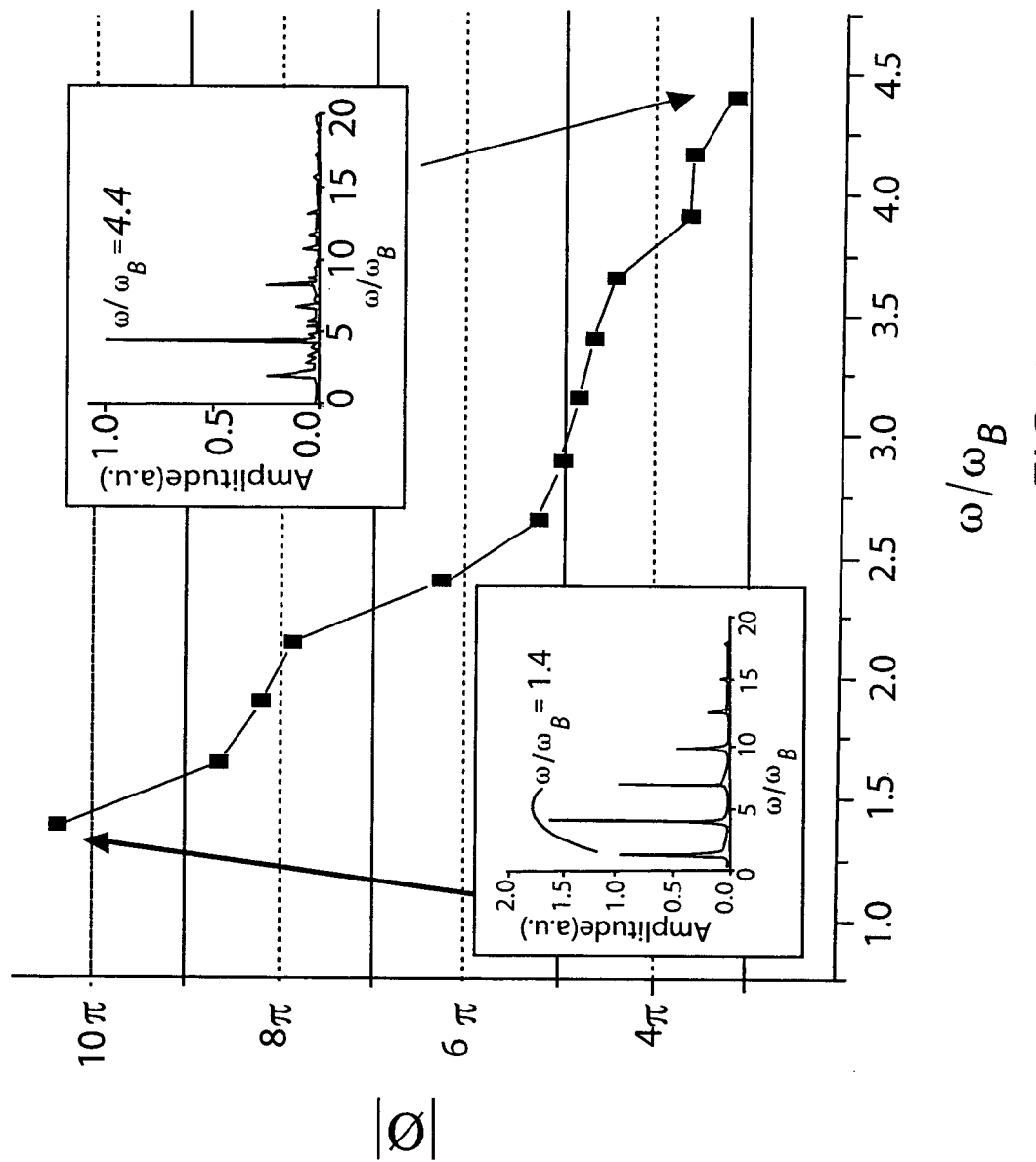
FIG. 6 are graphs illustrating the dependence of $|\phi|$ at the output of a five section left-handed nonlinear transmission line as a function of the relative fundamental frequency corresponding to data on the conversion efficiency shown in FIG. 5, with insets showing the spectra of voltage waveforms at the output to the load of the nonlinear transmission line for the fundamental relative frequencies 1.4 and 4.4 which correspond to the edges of the frequency range under consideration.

FIG. 6 shows the dependence of $|\phi|$ (defined by eqn. (20)) at the end of a 5-section LH nonlinear transmission line ($|\phi|=5|\beta_3-3\beta_1|$) on the fundamental frequency. For this purpose, the total phase shift of the fundamental wave and its $3^{rd}$ harmonic over the entire LH nonlinear transmission line has been calculated from the results of computer modeling. One can easily see that the maximum $3^{rd}$ harmonic generation efficiency at $\omega/\omega_B \approx 2.9$ corresponds to the maximum of the "coherence function" at the output of the LH system ($|\phi|=5\pi$) while the local minima at $\omega/\omega_B \approx 2.4$ and $\omega/\omega_B \approx 3.9$ corresponds to its minimum ($|\phi|=6\pi$ and $4\pi$, respectively). Another local maximum of efficiency near $\omega/\omega_B \approx 2.2$ corresponds to the range where denominator of function $F_A$ vanishes. The "coherence function" in this range is close to its minimum as well, restricting conversion efficiency.

On the lower frequency side the $3^{rd}$ harmonic generation region is bounded by the transmission line Bragg cutoff frequency as given in eqn. (2). The lower left inset in FIG. 6 shows for this case the spectrum of the voltage waveform at the output load of the LH system 20. A fundamental frequency of $\omega/\omega_B=1.4$ generates many higher harmonics, but most of the generated power is reflected back to the generator (due to intensive Bragg reflection).

A detailed analysis shows that, in the frequency range $2.9 \leq \omega/\omega_B \leq 3.7$, where the $3^{rd}$ harmonic conversion efficiency is maximum, the amplitude of voltage oscillations across the nonlinear capacitors 23 varies periodically from section to section. The period of this variation is equivalent to two sections 21. The amplitude is large ($U_{max} \sim U_{br}$) across odd capacitors 23 (starting from the input terminals) and small ($U_{max} \sim U_{br}/5$) across even capacitors 23. This correlates well with the period of the "coherence function," which requires that the $3^{rd}$ harmonic amplitude is maximal across even sections 21 and close to zero across odd ones.

This self-induced periodicity of voltage amplitude across the nonlinear capacitors 23 leads to a periodic variation of the capacitance along the line. Due to the strong nonlinearity (large capacitance ratio), this periodicity results in a considerable change of the dispersion characteristics and enables quasi-phase-matching of the fundamental wave and its $3^{rd}$ harmonic. This would otherwise be impossible in the linear limit (the analytic formula of eqn. (18) doesn't take this effect into account). Thus, the system 20 has the capability of self-supporting $3^{rd}$ harmonic generation in a wide frequency range. This self-induced quasi-phase-matching allows the amplitude of the $3^{rd}$ harmonic, at the points corresponding to the maximum of "coherence function," to grow from one maximum to the next along the transmission line, and thus enhances the conversion efficiency. Computer simulations of harmonic generation in LH nonlinear transmission line systems of different lengths (different numbers of sections 21) show that the conversion efficiency grows with the length of the transmission line, and finally saturates due to losses in the line. However, the 3-dB operating bandwidth decreases because $\phi$ becomes more sensitive to variation in the fundamental frequency with increase of n. The maximum of conversion efficiency generally takes place when $|\beta_3-3\beta_1| \approx \pi$, and self-induced periodicity occurs.

The conversion efficiency does not go to zero when the "coherence function" vanishes (when $|\phi|$ is $6\pi$ or $4\pi$), due to a variation of the phase shift per section along the line, given by the strong nonlinearity.

In summary, the analytical formulas obtained above allow explanation of the basic features of the frequency dependence of the $3^{rd}$ harmonic conversion efficiency and can be useful for optimization of the parameters of the LH nonlinear transmission line system 20. Computer simulations also predict self-supporting $3^{rd}$ harmonic generation for the case where $|\beta_3-\beta_1| \approx \pi$.

Furthermore, the periodicity (or discreteness) of the LH nonlinear transmission lines is essential for harmonic generation and is inherent in such system formed of discrete components. However, to get harmonic generation in quasi-homogenous left-handed materials, such as those using arrays of metallic wires and split-ring resonators the arrays should be loaded periodically with nonlinear components.

Figure 7:
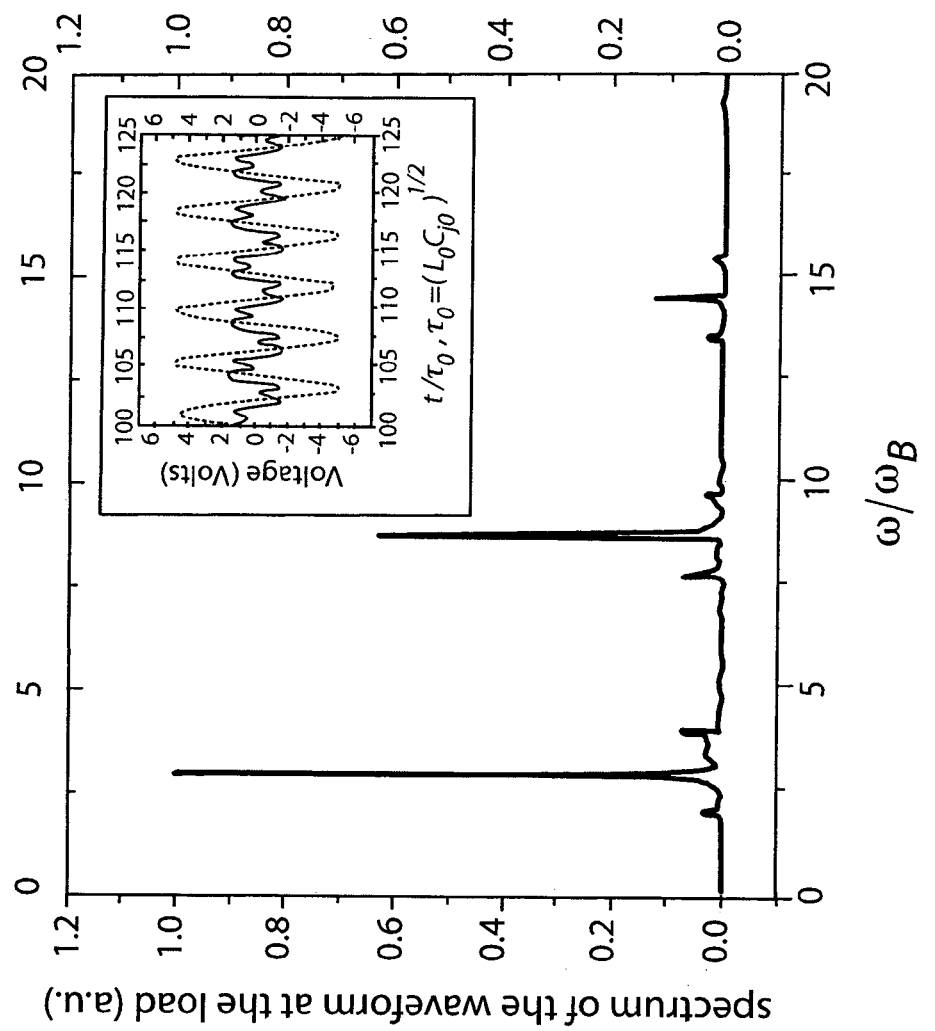
FIG. 7 is a graph showing the spectrum of the voltage waveform at the output load of a left-handed nonlinear transmission line system corresponding to the maximum of third harmonic conversion efficiency at a fundamental frequency $\omega_{inp}/\omega_B=2.89$, with an inset showing the original waveform in solid line and the voltage waveform at the input in dashed line.

FIG. 7 shows the spectrum of the voltage waveform at the load corresponding to the maximum $3^{rd}$ harmonic conversion efficiency and the inset in FIG. 7 compares the original waveform with the waveform at the input. The $5^{th}$ harmonic conversion efficiency is $\leq 1\%$, so power conversion in the $3^{rd}$ harmonic is very efficient (about 19%), and generation of higher harmonics is suppressed. Assuming $R_L$ to be 50 $\Omega$, one can solve for circuit parameters specified above, arriving at the value for the fundamental (input) frequency corresponding to the maximum conversion efficiency to be 3.7 GHz and for the value of the power of the $3^{rd}$ harmonic delivered to the load to be 14 mW.

For comparison, FIG. 5 shows $3^{rd}$ harmonic generation efficiency in a dual RH nonlinear transmission line of the same length (same number of sections) and based on the same back-to-back varactor diodes used as nonlinear capacitors. The $3^{rd}$ harmonic generation efficiency in the LH nonlinear transmission line 20 is higher (19% vs. 14%) and occurs at higher frequencies (maximum at $\omega/\omega_B \approx 2.9$ vs. $\omega/\omega_B \approx 1.9$), and has wider 3-dB operating bandwidth (60% vs. 30%). The $3^{rd}$ harmonic conversion efficiency in the LH nonlinear transmission line 20 is of the same order as that which can be obtained in a conventional periodically loaded nonlinear transmission line with normal dispersion (of the low-pass filter type), but the required transmission line length is shorter for the LH nonlinear transmission line, and thus the per-section efficiency is higher.

The decrease in $3^{rd}$ harmonic generation efficiency at the higher frequency boundary is related to other mechanisms of frequency conversion. One of them is the instability known as parametric generation of traveling waves. A. S. Gorshkov, et al., "Parametric generation in Anamalously Dispersive Media," Physica D, Vol. 122, 1998, pp. 161–177. It is known that parametric generation and amplification in dispersionless RH nonlinear transmission lines is suppressed by shock wave formation. R. Landauer, "Shock Waves in Nonlinear Transmission Lines and their Effect on Parametric Amplification," IBM Journal, Vol. 4, October 1960, pp. 391–401; R. Landauer, "Parametric Amplification Along Nonlinear Transmission Line," J. Appl. Phys., Vol. 31, No. 3, March 1960, pp. 479–484. The impossibility of shock waves in LH nonlinear transmission lines gives rise to a variety of parametric processes that compete with harmonic generation.

Parametric generation is possible in the LH NLTL system of the invention for appropriate parameters of the input drive signal (frequency and amplitude). At parameters chosen for parametric generation, the fundamental signal generates Stokes and anti-Stokes waves instead of higher harmonics. Parametric generation occurs at significantly lower voltage amplitudes of the input drive signal than are used for harmonic generation but almost in the same frequency range.

Figures 8, 9:
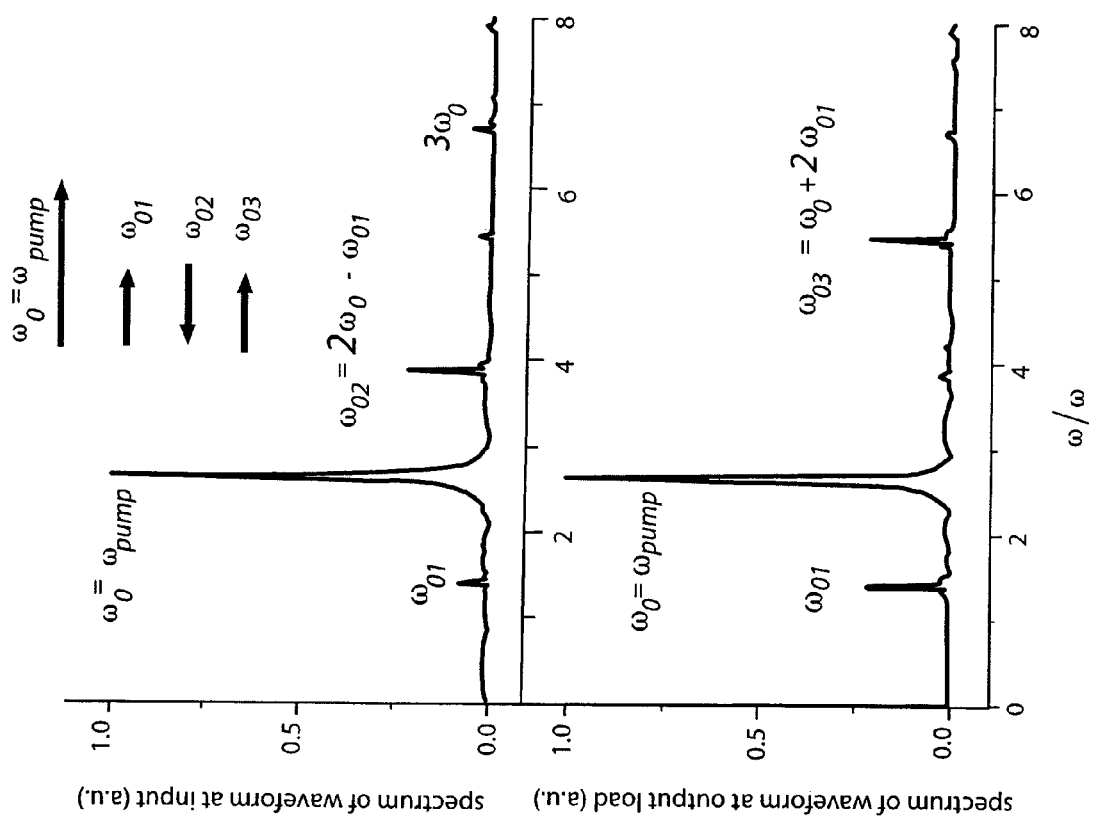
FIG. 8 is a graph showing the spectrum of the waveform at the input of a seven section left-handed nonlinear transmission line system ($R_1/Z_0=1$, $V_{inp}=2V$, $\omega_0/\omega_B=2.6$).
FIG. 9 is a graph showing the spectrum of the waveform at the output of the seven section left-handed nonlinear transmission line system as in FIG. 8.

The high-frequency fundamental (pump) wave with frequency $\omega_0$, and wavenumber $\beta_0$, generates two other waves with frequencies $\omega_{01}<\omega_0$ and $\omega_{02}=2\omega_0-\omega_{01}$. This is illustrated in FIGS. 8 and 9, since $\omega_0-\omega_{01}=\omega_{02}-\omega_0$, we refer here to waves $\omega_{01}$ and $\omega_{02}$ as respectively Stokes and anti-Stokes waves by analogy with nonlinear optics. The anti-Stokes wave at $\omega_{02}$ propagates in the opposite direction relative to the fundamental (pump) wave and Stokes waves. We can see a peak at $\omega_{02}$ in the spectrum of the input waveform, while it is absent at the output. Otherwise, the peak corresponding to the Stokes wave $\omega_{01}$ is larger at the output. The backward-propagating parametrically generated anti-Stokes wave $\omega_{02}$ enables internal feedback. We therefore have a similar situation to backward wave parametric generation. A. S. Gorshkov, supra; S. E. Harrisn, "Proposed Background Wave Oscillation in the Infrared," Appl. Phys. Lett., Vol. 9, No. 3, August 1966, pp. 114–116. Interaction of fundamental wave $\omega_0$ and Stokes wave $\omega_{01}$ also lead to generation of co-propagating wave at $\omega_{03}=\omega_0+2\omega_{01}$.

The anomalous dispersion of left-hand medium allows phase matching of the fundamental wave and parametrically generated waves so that the "coherence length" of the nonlinear parametric processes described above is large. The amplitude of parametrically generated waves should grow with distance and should compete with harmonic generation in the case of longer lines.

Thus, parametric generation assumes that an intensive high-frequency input wave (pump wave) generates two other waves so that all three waves are phase matched. In the case of parametric amplification we have two input waves: intensive pump wave and low-power signal wave. Power from pump wave is transferred to signal wave and so amplifies it. The third parasitic idler wave is generated too in order to provide phase matching. For use of the LH NLTL system as a parametric amplifier, two sources are connected to supply an input to the system, in order to generate a high power pump signal and a low power signal to be amplified. Actually, two configurations are possible: 1) signal is Stokes wave ($\omega_{signal}<\omega_{pump}$): both pump and signal waves should be generated at the input of LH NLTL; or 2) signal is anti-Stokes wave ($\omega_{signal}>\omega_{pump}$): pump and signal wave should be generated at the opposite sides of the LH NLTL.

The backward-propagating anti-Stokes wave w02 enables internal feedback. We can get amplifying system without external resonator in a very simple configuration and this is very attractive.

Waveform evolution in the LH nonlinear transmission line of the invention has many similarities with the competition between resonant excitations and nonlinear parametric interactions recently discussed in nonlinear optics. See R. Frey, "Suppression of the Medium Excitation in Resonant Nonlinear Optics," Opt. Comm., Vol. 89, No. 5–6, 15 May 1992, pp. 441–446, and the references cited therein.

Another interesting feature enabled by the interplay of anomalous dispersion and nonlinearity is the generation of fractional frequencies by high frequency fundamental waves. Generation of fractional frequencies becomes possible when the frequency of the fundamental wave exceeds $3\omega_B$. Anomalous dispersion allows phase-matching of the fundamental wave with frequency $\omega_1$ and wavenumber $\beta_1$ with one of its fractional harmonics having frequency $\omega_{1/m}=\omega_1/m$ and wavenumber $\beta_{1/m}=m\beta_1$ (m is an integer number) so that the LH nonlinear transmission line can function as a frequency divider. One can apply the analysis above to show that the "coherence length" between the fundamental wave and a wave at some fractional frequency can be very long, as determined by $$N_c \sim \frac{2\pi}{\beta_{1/m} - m\beta_1} \qquad (27)$$

Figure 10:
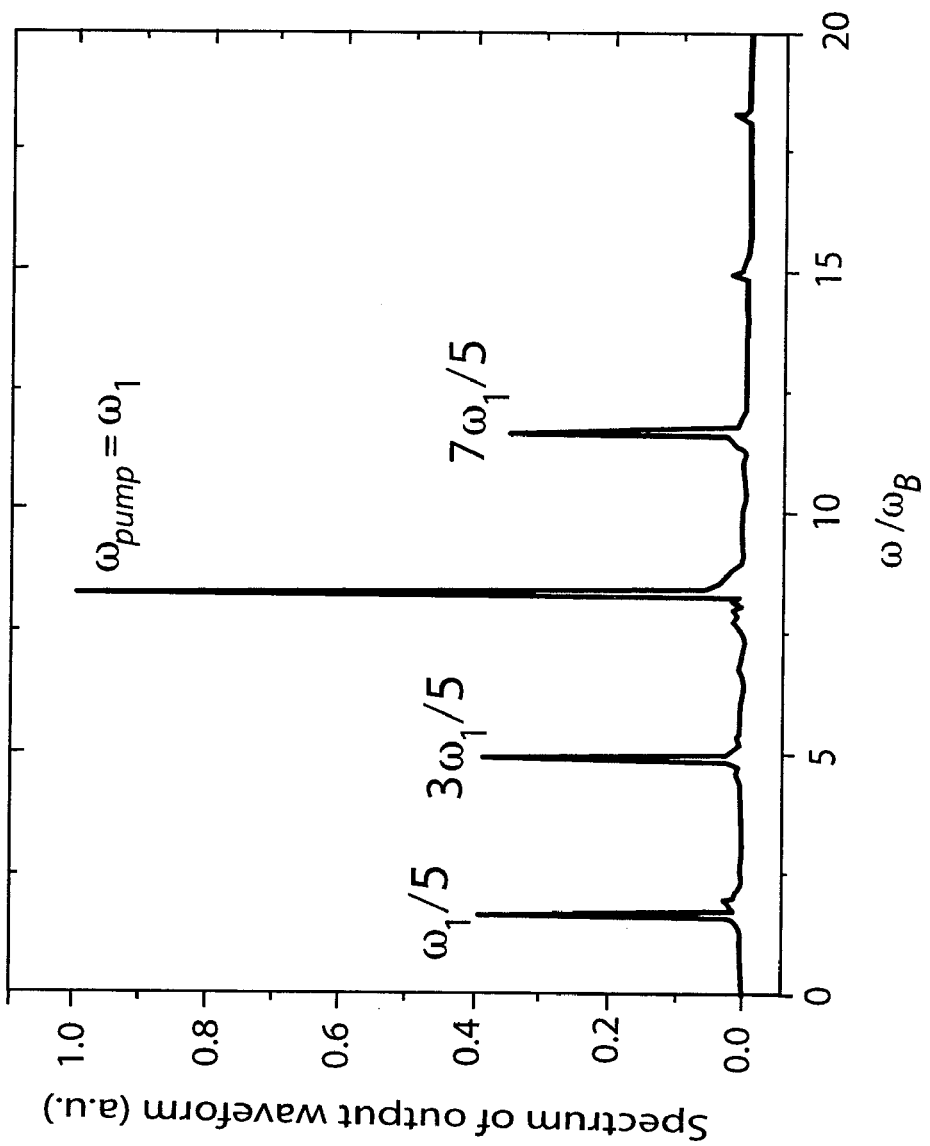
FIG. 10 are graphs illustrating the spectrum of the waveform at the output of a seven section left-handed nonlinear transmission line system with $R_1/Z_0=1$, $V_{inp}=4.25V$, $\omega_1/\omega_B=8.3$.

FIG. 10 shows the spectrum of the voltage waveform at the output port of a 7-section LH nonlinear transmission line. The fundamental wave $\omega_1$ effectively generates three other waves with frequencies $1/5\omega_1$, $3/5\omega_1$, and $7/5\omega_1$.

Under some conditions, LH nonlinear transmission lines exhibit mixed behavior when parametrically generated waves start generating harmonics and vice versa. Parametric generation can be stimulated by harmonics of the fundamental wave resulting in a very complicated spectrum of the voltage waveform at the output. The upper inset in FIG. 6 gives an example of such behavior. One can find peaks related to parametric generation, higher harmonics and fractional harmonics. Small peaks near the fundamental frequency and its higher harmonics in FIG. 7 also result from parametric generation. Thus, LH nonlinear transmission lines can be operated in many regimes, and switching between different regimes can be accomplished by changing the amplitude or frequency of the input signal. Unlike in the case of generation of higher harmonics, the periodicity (discreteness) is not essential for either parametric generation or generation of fractional frequencies, both of which can be observed in homogeneous left-handed nonlinear medium too.

It is noted that all the qualitative considerations presented here are valid for second harmonic generation in LH nonlinear transmission line systems periodically loaded with biased diodes having asymmetric capacitance-voltage characteristics. The preference given to third order nonlinearity (symmetric capacitance-voltage characteristics) arises from the fact that two-dimensional (2-D) and three-dimensional (3-D) array structures can be more easily realized if they do not require biasing.

The preferred number of transmission line sections to be used depends on the intended function of the system. For generation of harmonics with the Agilent varactor diodes used as nonlinear capacitors as discussed above, a five section line provides the best conversion efficiency. Systems used for parametric amplification will generally require a large number of sections. The upper limit is usually determined by loss in the line.

Figure 11:
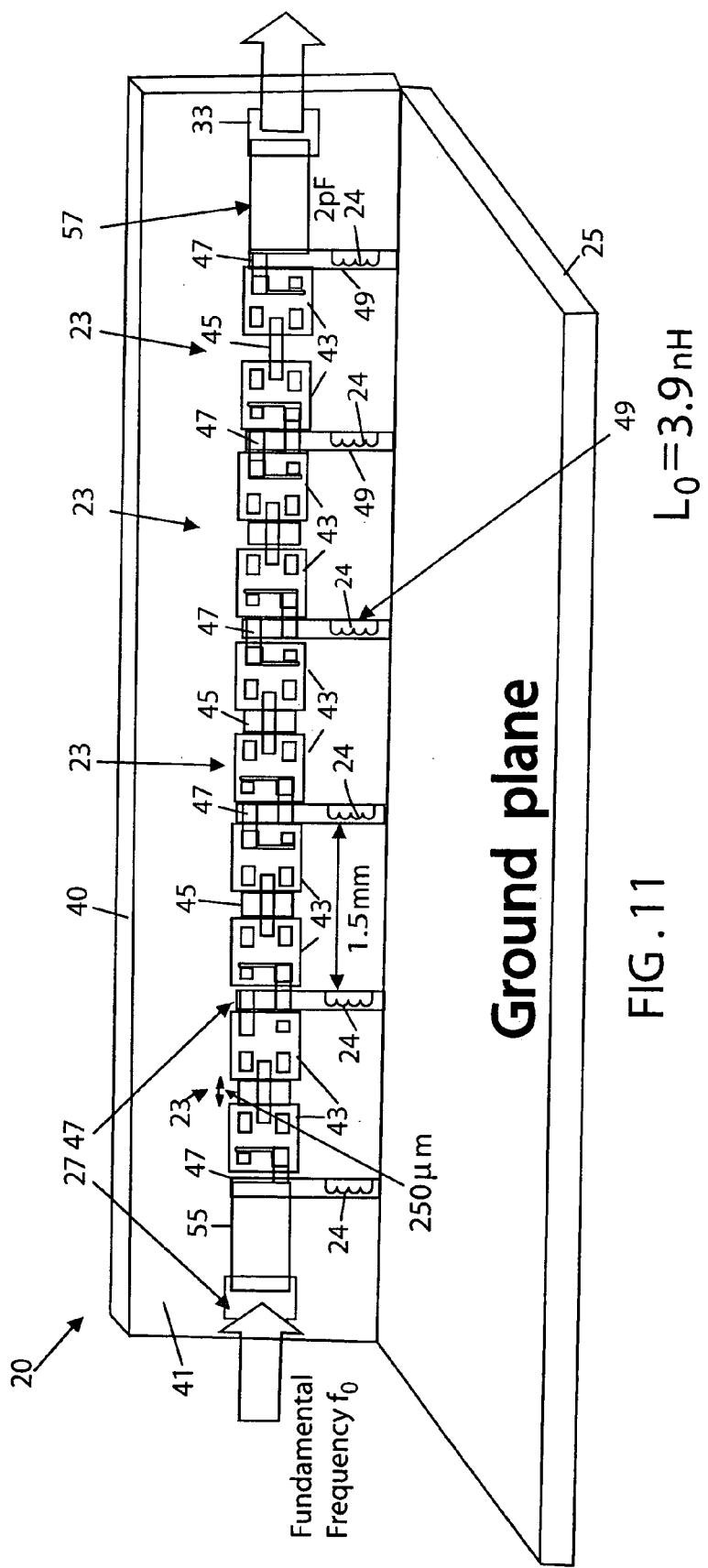
FIG. 11 is a simplified perspective view of an implementation of a left-handed nonlinear transmission line system in accordance with the invention.

FIG. 11 shows an illustrative implementation of the left-handed nonlinear transmission line system 20 of the invention. In the implementation of FIG. 11, an insulating base 40, e.g., of glass or alumina, has a top surface 41 to which the transmission line components are mounted. The nonlinear capacitors 23 are formed, e.g., of a pair of back-to-back varactor diodes 43 (e.g., Agilent TC803 hyperabrupt varactor diodes), with each pair of diodes being connected together by a metal pad 45 that extends between the cathode contacts of each of the diodes 43 and over the surface 41 between the diodes 43. These diodes have a highly nonlinear capacitance-voltage relationship, with the effective capacitance at 10 volts being about 17 times the effective capacitance at about 0 volts. It is understood that any other devices having nonlinear capacitance characteristics may also be utilized with appropriate circuit designs. Asymmetrical nonlinear capacitance characteristics may also be obtained utilizing a single diode (or more than one diode) with biasing of the diode to prevent direct current forward conduction. The pairs of diodes 43 are connected together by metal pads 47 formed on the base surface 41 and extending to the anode contacts of the diodes in adjacent pairs of diodes 43. Electrical conductors 49 extend from the pads 45 to a ground plane return conductor 25 (e.g., formed of a sheet of metal) to define the inductors 24. The conductors 49 may be formed, for example, as a length of ribbon wire or a metal strip formed on the surface 41 of the insulating base 40. Input terminal 27 and output terminal 33 may be formed as metal pads on the surface 41 with the input terminal 27 connected by a metal connector 55 formed on the surface 41 that extends to the metal pad 47 connected to the first pair of diodes 43, and with the output terminal 33 connected by a metal conductor 57 formed on the surface 41 that extends from the output terminal 33 to the metal pad 47 connected to the last of the pairs of diodes 43. It is understood that the foregoing describes only one example of the invention, and that the invention may be, as a further example, implemented as an integrated circuit on a suitable substrate (such as GaAs, InAs, InGaAs, Si, diamond, etc.).

Figure 12:
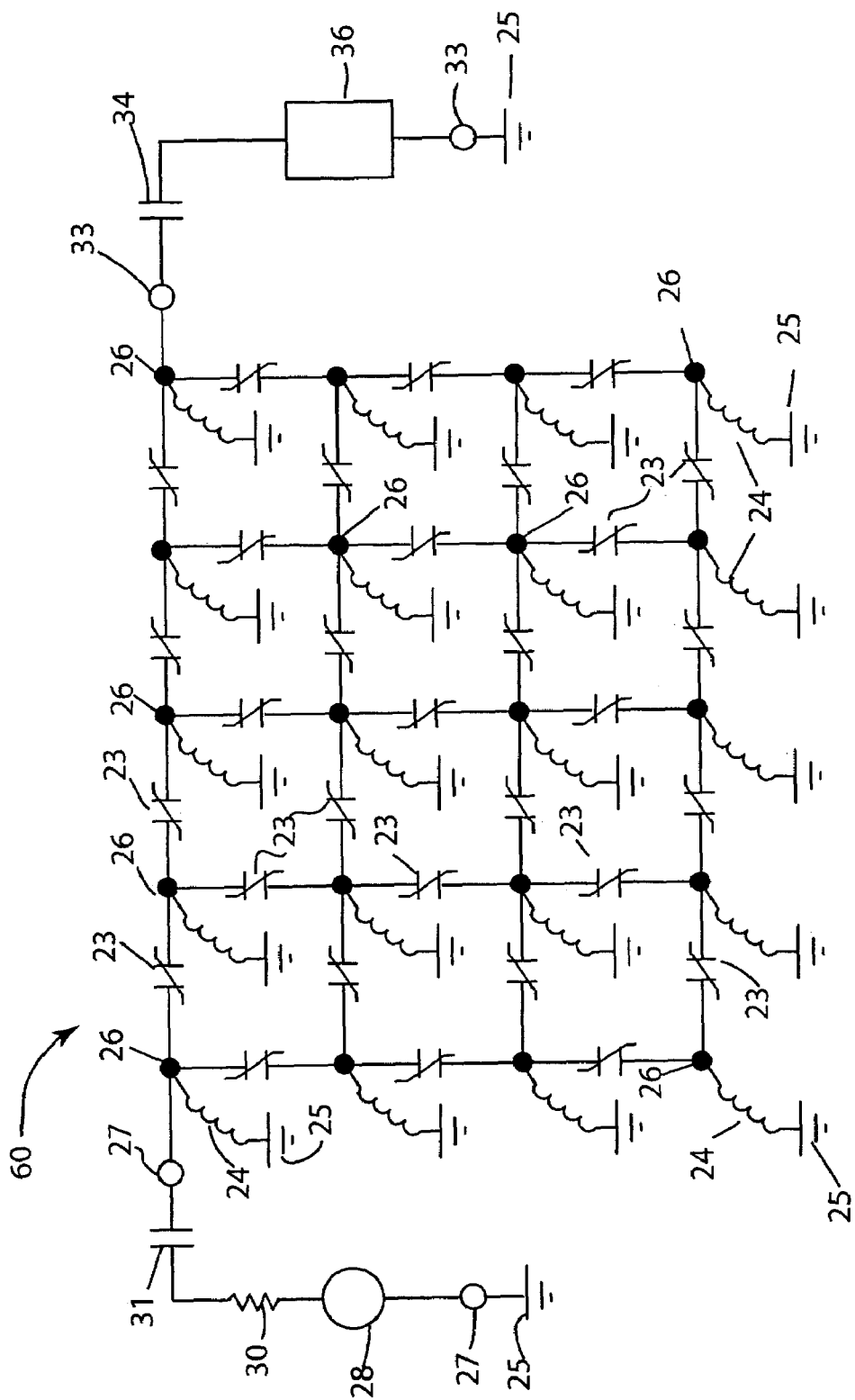
FIG. 12 is a schematic circuit diagram of a two-dimensional array left-handed nonlinear transmission line system in accordance with the invention.
Figure 13:
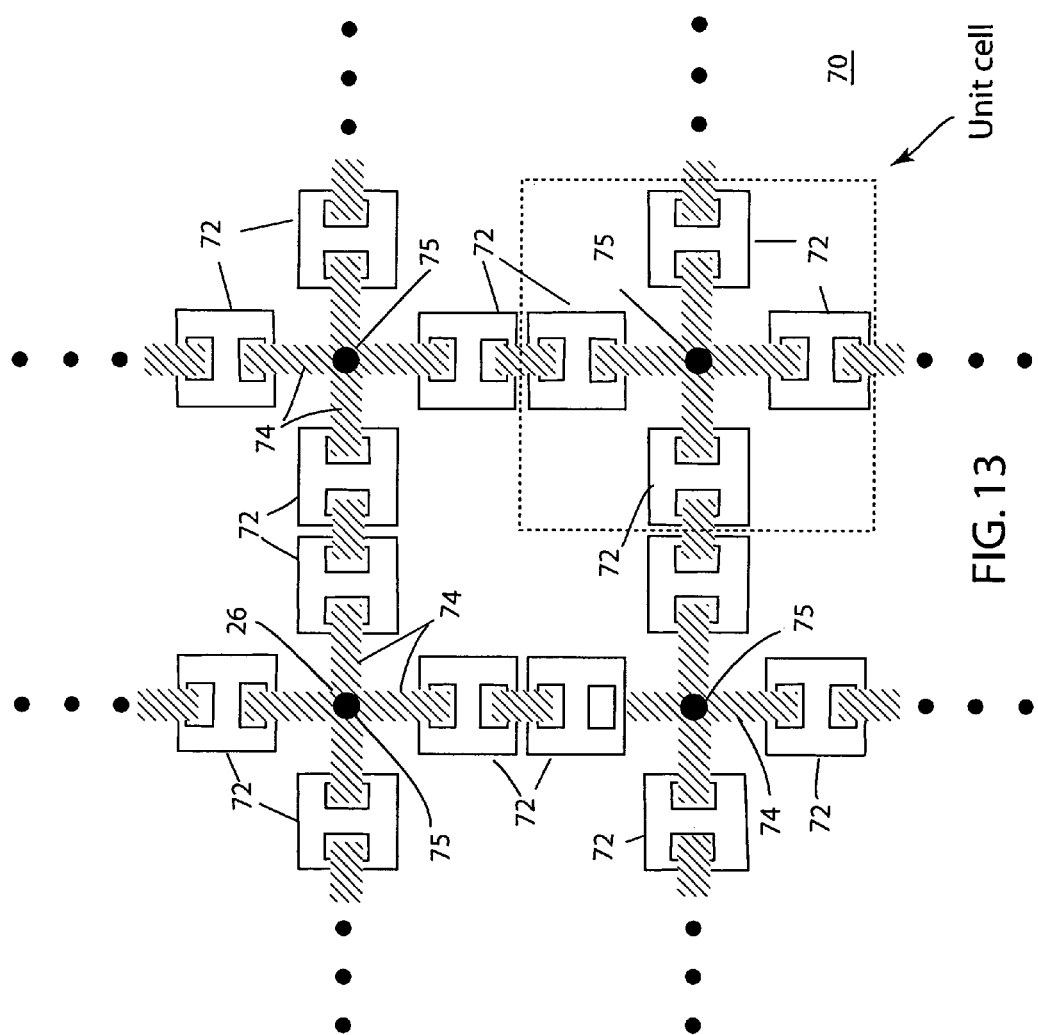
FIG. 13 is a simplified plan view of an implementation of a two-dimensional left-handed nonlinear transmission line system in accordance with the invention.

An exemplary two-dimensional array left-handed nonlinear transmission line system in accordance with the invention is shown generally at 60 in FIG. 12. In the system 60, the nonlinear capacitors 23 are connected together at nodes 26 to form a two-dimensional array of capacitors, and each of the nodes 26 is connected to ground return 25 via an inductance 24. One or more input nodes 27 may be supplied with a signal from a source 28, and one or more output nodes 33 may be connected to a load or loads 36. The invention may also be embodied in a three-dimensional left-handed nonlinear transmission line array in which there is a three-dimensional array of nodes 26, with nonlinear capacitors 23 connected between each pair of adjacent nodes in three dimensions, and with each of the nodes 26 connected via an inductance 24 to ground return 25. The invention may also be embodied in quasi-homogenous nonlinear media by utilizing nonlinear capacitive elements 23 between one, two, or three dimensional arrays of nodes within the media. FIG. 13 illustrates a physical implementation of a two-dimensional LH NLTL formed on the surface of an insulating base 70 (e.g., glass or alumina). Varactor diode chips 72 are mounted back to back in pairs to form the nonlinear capacitors 23, and the pairs of diodes 72 are connected together by conducting metal pads 74 which join at nodes 26. Via holes filled with metal 75 are connected to the conducting pads 74 at the nodes 26 to form the parallel inductors that connect to a conducting plane (not shown in FIG. 13) beneath the insulating substrate 70.

Figure 14:
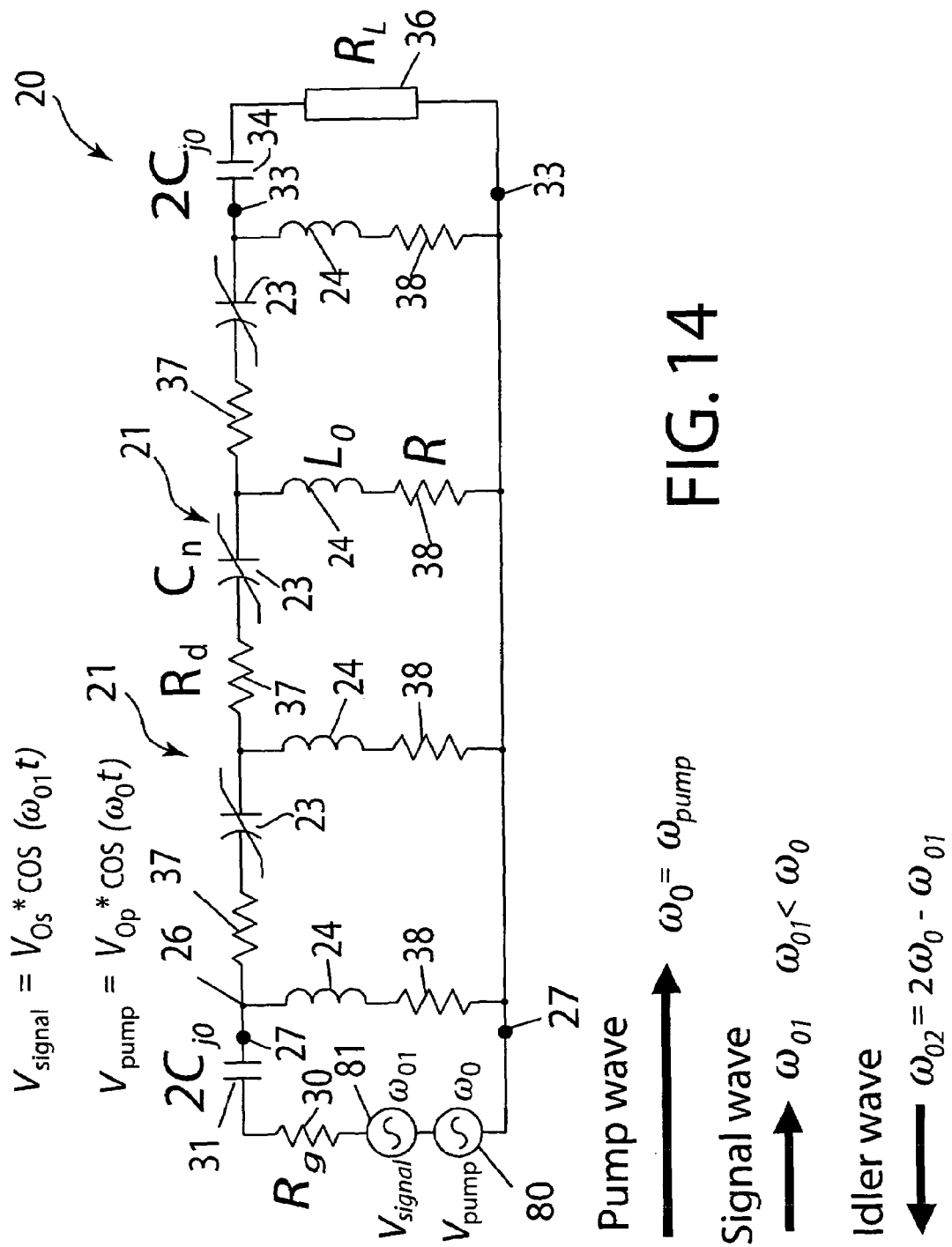
FIG. 14 is a schematic circuit diagram of the left-handed nonlinear transmission line system operating as a parametric amplifier.
Figure 15:
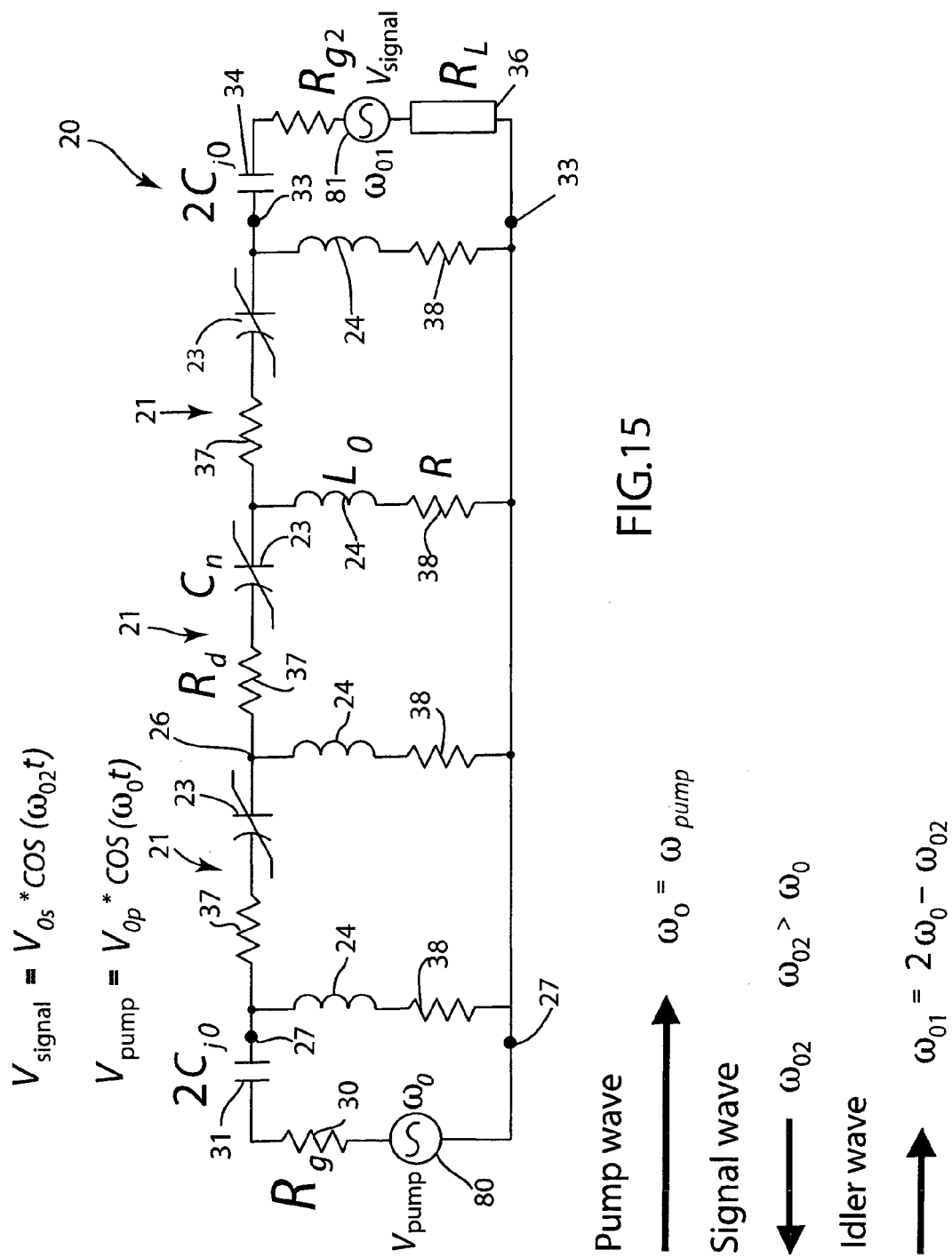
FIG. 15 is a schematic circuit diagram of the left-handed nonlinear transmission line system in another implementation as a parametric amplifier.

The invention may also be embodied in a parametric amplifier configuration in which a pump signal is applied to the left-handed nonlinear transmission line system of the invention along with a signal to be amplified. FIG. 14 illustrates a first example of a parametric amplifier configuration in which a pump voltage source 80 and a signal voltage source 81 are connected together in series and coupled to input terminals of the left-handed nonlinear transmission line. The voltage source 80 provides a pump voltage $V_{pump}$ at a frequency $\omega_0$ that generates a pump wave that propagates toward the load at the output. The signal voltage source 81 provides a signal voltage $V_{signal}$ to be amplified at a frequency $\omega_{02}$ which is higher than $\omega_0$, and power from the pump wave is transferred to the signal wave and an idler wave at a frequency $\omega_{01}=2\omega_0-\omega_{02}$ (which is required to provide phase matching). In the configuration shown in FIG. 15, the pump source 80 is coupled to the input terminals of the transmission line and the signal source 81 is coupled to the output terminals of the transmission line in series with the load.

It is understood that the invention is not confined to the particular embodiments set forth herein as illustrative, but embraces all such forms thereof as come within the scope of the following claims.

What is claimed is:

1. A left-handed nonlinear transmission line system comprising:
   (a) input and output terminals;
   (b) multiple nonlinear capacitors connected together at nodes in series between the input and output terminals, the capacitors having a non-constant relationship between capacitance and voltage across the capacitors and having a symmetric capacitance-voltage characteristic in which the effective capacitance decreases with the voltage level across the capacitor; and
   (c) multiple inductances connected in parallel between the capacitors and a return conductor that extends between the input and output terminals to form a discrete transmission line having a plurality of sections.

2. The system of claim 1 wherein the nonlinear capacitors are formed of back-to-back varactor diodes.

3. The system of claim 2 wherein the varactor diodes are mounted on an insulating base and are connected together by metalized connector strips formed on the base and extending to contacts on the diodes, and wherein the parallel inductances are formed of metal connector strips extending from a connection to a pair of back-to-back diodes to a ground plane return conductor.

4. The system of claim 3 wherein the insulating base is formed of glass or alumina and wherein the ground plane conductor is a sheet of metal.

5. The system of claim 1 further including a radio frequency source coupled via a capacitor to the input terminals of the nonlinear transmission line system and including a load coupled to the output terminals of the nonlinear transmission line system.

6. The system of claim 5 wherein the radio frequency source provides an input drive signal at a frequency $\omega$ which is greater than the Bragg cutoff frequency $\omega_B$ for the nonlinear transmission line system.

7. The system of claim 5 wherein the radio frequency source is coupled to the input terminals via a capacitor of capacitance $2C_{j0}$, the signal source providing a signal at a frequency ω greater than $\omega_B$ wherein $\omega_B = \frac{1}{2}\sqrt{L_0 C_{j0}}$, and wherein $L_0$ is the inductance of the parallel inductances.

8. The system of claim 5 wherein the source provides a signal such that the phase mismatch between fundamental wave and its third harmonic is $|\beta_3 - 3\beta_1| \cong \pi$ for generation of third harmonic components at the output terminals of the system.

9. The system of claim 5 wherein the frequency ω of the radio frequency source is at least three times the Bragg cutoff frequency $\omega_B$ to generate fractional frequencies in the output signal at the output terminals.

10. The system of claim 1 wherein the nodes are formed in a two-dimensional matrix of nodes with nonlinear capacitors connected between the nodes and with an inductance connected to each of the nodes extending to the return conductor to define a two-dimensional matrix of discrete transmission line sections.

11. A parametric amplifier system comprising:
  (a) a left-handed nonlinear transmission line system comprising:
    (1) input and output terminals;
    (2) multiple nonlinear capacitors connected together at nodes in series between the input and output terminals, the capacitors having a non-constant relationship between capacitance and voltage across the capacitors and having a symmetric capacitance-voltage characteristic in which the effective capacitance decreases with the voltage level across the capacitor; and
    (3) multiple inductances connected in parallel between the capacitors and a return conductor that extends between the input and output terminals to form a discrete transmission line having a plurality of sections;
  (b) a pump source coupled to the transmission line system to provide power at frequency $\omega_0$; and
  (c) a signal source coupled to the transmission line system to provide power at a frequency signal $\omega_{signal}$.

12. The system of claim 11 wherein the pump source and the signal source are connected in series and coupled to the input terminals of the transmission line system.

13. The system of claim 11 wherein the pump source is coupled to the input terminals and the signal source is coupled to the output terminals of the transmission line system.

14. The system of claim 11 wherein the nonlinear capacitors are formed of back-to-back varactor diodes.

15. The system of claim 12 wherein the pump source and signal source are coupled via a capacitor to the input terminals of the nonlinear transmission line system and including a load coupled to the output terminals of the nonlinear transmission line system.

16. The system of claim 15 wherein the pump source and signal source are coupled to the input terminals via a capacitor of capacitance $2C_{j0}$, the signal source providing a signal at a frequency ω greater than $\omega_B$ wherein $\omega_B = \frac{1}{2}\sqrt{L_0 C_{j0}}$, and wherein $L_0$ is the inductance of the parallel inductances.

17. The system of claim 11 wherein the nodes are formed in a two-dimensional matrix of nodes with nonlinear capacitors connected between the nodes and with an inductance connected to each of the nodes extending to the return conductor to define a two-dimensional matrix of discrete transmission line sections.

* * * * *

UNITED STATES PATENT AND TRADEMARK OFFICE
CERTIFICATE OF CORRECTION

PATENT NO.       : 7,135,917 B2                                Page 1 of 1
APPLICATION NO.  : 10/860389
DATED            : November 14, 2006
INVENTOR(S)      : Alexander B. Kozyrev and Daniel W. van der Weide It is certified that error appears in the above-identified patent and that said Letters Patent is hereby corrected as shown below:

IN THE SPECIFICATION:

<u>Column 10, Line 33:</u> Delete "$|\beta_3 - \beta_1| \approx \pi$" and replace with -- $|\beta_3 - 3\beta_1| \approx \pi$ --.

Signed and Sealed this

Twenty-fourth Day of April, 2007

JON W. DUDAS
*Director of the United States Patent and Trademark Office*